United States Patent
Yoo et al.

(10) Patent No.: US 9,552,016 B2
(45) Date of Patent: Jan. 24, 2017

(54) MOBILE TERMINAL

(71) Applicant: LG ELECTRONICS INC., Seoul (KR)

(72) Inventors: Joonhee Yoo, Seoul (KR); Jinhwan Lee, Seoul (KR); Suhyeong Lee, Seoul (KR)

(73) Assignee: LG ELEVTRONICS INC., Seoul (KR)

( * ) Notice: Subject to any disclaimer, the term of this patent is extended or adjusted under 35 U.S.C. 154(b) by 0 days.

(21) Appl. No.: 14/846,391

(22) Filed: Sep. 4, 2015

(65) Prior Publication Data

US 2016/0313765 A1  Oct. 27, 2016

(30) Foreign Application Priority Data

Apr. 27, 2015 (KR) .................. 10-2015-0059053

(51) Int. Cl.
*G06F 1/16* (2006.01)
*H05K 5/00* (2006.01)

(52) U.S. Cl.
CPC ........... *G06F 1/1633* (2013.01); *H05K 5/0008* (2013.01)

(58) Field of Classification Search
CPC .................................................. G06F 1/1601
See application file for complete search history.

(56) References Cited

U.S. PATENT DOCUMENTS

| | | | |
|---|---|---|---|
| 8,737,052 B2 * | 5/2014 | Cho | H04B 1/3883 200/5 A |
| 2008/0084994 A1 | 4/2008 | Chuang | |
| 2009/0170577 A1 | 7/2009 | Liu | |
| 2011/0255220 A1 | 10/2011 | Liu et al. | |

FOREIGN PATENT DOCUMENTS

EP    1473909    11/2004

OTHER PUBLICATIONS

European Patent Office Application No. 15002558.3, Search Report dated Sep. 30, 2016, 8 pages.

* cited by examiner

*Primary Examiner* — Anthony Q Edwards
(74) *Attorney, Agent, or Firm* — Lee, Hong, Degerman, Kang & Waimey

(57) ABSTRACT

There is disclosed a mobile terminal including a front case, a first rear case shaped to cover a first area of a rear surface of the front case, a second rear case shaped to cover the second area of the rear surface of the front case, a tightening groove formed in the portion where the first rear case and the second rear case are coupled with each other and comprising inclined surfaces a first tightening rib projected from a front surface of the first rear case and comprising an inclined surface corresponding to one inclined surface of the tightening groove, a second tightening rib projected from the front surface of the second rear case and comprising an inclined surface corresponding to the other inclined surface of the tightening groove, wherein the first tightening rib and the second tightening rib are inserted in the tightening groove.

12 Claims, 6 Drawing Sheets

MOBILE TERMINAL

CROSS-REFERENCE TO RELATED APPLICATIONS

Pursuant to 35 U.S.C. §119(a), this application claims the benefit of earlier filing date and right of priority to Korean Patent Application No. 10-2015-0059053 filed on Apr. 27, 2015, the contents of which are hereby incorporated by reference herein it its entirety.

BACKGROUND OF THE DISCLOSURE

Field of the Disclosure

Embodiments of the present disclosure relate to a display panel which may display an image on a predetermined area of a display unit and a mobile terminal including the same.

Background of the Disclosure

Terminals may be generally classified as mobile/portable terminals or stationary terminals according to their mobility. Mobile terminals may also be classified as handheld terminals or vehicle mounted terminals according to whether or not a user can directly carry the terminal.

Mobile terminals have become increasingly more functional. Examples of such functions include data and voice communications, capturing images and video via a camera, recording audio, playing music files via a speaker system, and displaying images and video on a display. Some mobile terminals include additional functionality which supports game playing, while other terminals are configured as multimedia players. More recently, mobile terminals have been configured to receive broadcast and multicast signals which permit viewing of content such as videos and television programs.

As such functions become more diversified, the mobile terminal can support more complicated functions such as capturing images or video, reproducing music or video files, playing games, receiving broadcast signals, and the like. By comprehensively and collectively implementing such functions, the mobile terminal may be embodied in the form of a multimedia player or device.

Importance of wireless communication techniques is increasingly emphasized to gain contents easily. The mobile terminal includes various types of antennas so as to receive and transmit data in manners of diverse radio systems. An antenna is loaded in a rear case of the mobile terminal and the portion having the antenna is fabricated in a different way from the other portion of the rear case. The portions are formed of different materials independently and they are then coupled to a front case.

The rear case configured of two pieces has a predetermined gap and this gap deteriorates an exterior appearance. The two pieces are fabricated independently so that fabrication errors can be increased and that the rigidity between the two pieces can become weak disadvantageously.

SUMMARY OF THE DISCLOSURE

Accordingly, an object of the present disclosure is to address the above-noted and other problems. Another object of the present disclosure is to provide a mobile terminal which may improve a connecting structure of a rear case configured of two pieces.

Embodiments of the present disclosure may provide a mobile terminal including a front case comprising a front surface where a display unit is mounted; a first rear case coupled to the front case and configured to cover a predetermined area of a rear surface of the front case; a second rear case coupled to the front case and configured to cover the other area of the rear surface of the front case, with at least predetermined portion in close contact with the first rear case; a tightening groove formed in the portion where the first rear case and the second rear case are in close contact with each other in the rear surface of the front case and comprising inclined surfaces provided in one and the other directions; a first tightening rib projected from a front surface of the first rear case and comprising an inclined surface corresponding to one inclined surface of the tightening groove; a second tightening rib projected from the front surface of the second rear case and comprising an inclined surface corresponding to the other inclined surface of the tightening groove, wherein the first tightening rib and the second tightening rib are inserted in the tightening groove when the first rear case and the second rear case are coupled to the front case.

The tightening groove may be formed in a diamond shape, and the first tightening rib may be formed in a diamond shape and the second tightening rib is formed in a triangle shape.

The first tightening rib and the second tightening rib include a flexible material, and the first rear case and the second rear case may be connected to each other in a manner of double-injection molding.

The mobile terminal may further include one or more screws fastened to the front case, passing through the first rear case and the second rear case, and at least one of the one or more screws may be fastened adjacent to the tightening groove.

The mobile terminal may further include a connecting slot extended from the other end of the first rear case in close contact with the second rear case in a y-axial direction; a connecting projection projected from one end of the second rear case in close contact with the first rear case in a y-axial direction; a securing hook projected from an inner surface of the connecting slot; and a securing groove formed in the connecting projection to insertedly receive the securing hook, wherein the first rear case and the second rear case are arranged in parallel in a y-axial direction.

The securing hook may be projected in z-axial direction which is a thickness direction of the mobile terminal, and the connecting slot may include an open portion formed in a surface facing the surface where the securing hook is projected.

The mobile terminal may further include a movement preventing projection projected in an x-axial direction vertical to the z-axial direction in which the securing hook is projected.

A plurality of movement preventing projections may provided in y-axial direction, spaced apart a predetermined distance from each other.

The movement preventing projection may include an inclined surface provided in a surface toward an entrance of the connecting slot.

The movement preventing projection may be extended in the y-axial direction and formed in a diamond shape.

The mobile terminal may further include a reinforcing rib projected from the connecting projection connected with the second rear case, with the thickness larger than the thickness of the connecting projection.

The mobile terminal may further include an antenna printed in a surface of the second rear case.

The mobile terminal and the control method of the same in accordance with the present disclosure have following effects.

According to at least one of embodiments, the space between the rear cases configured as two pieces may be reduced and the external aesthetic impression of the rea surface of the mobile terminal.

Furthermore, the rear case may be configured as one material so that the coupling efficiency of the rear case to the front case and the rigidity of the rear case can be enhanced.

Further scope of applicability of the present invention will become apparent from the detailed description given hereinafter. However, it should be understood that the detailed description and specific examples, while indicating preferred embodiments of the invention, are given by illustration only, since various changes and modifications within the spirit and scope of the invention will become apparent to those skilled in the art from this detailed description.

DESCRIPTION OF SPECIFIC EMBODIMENTS

Figure 1A:
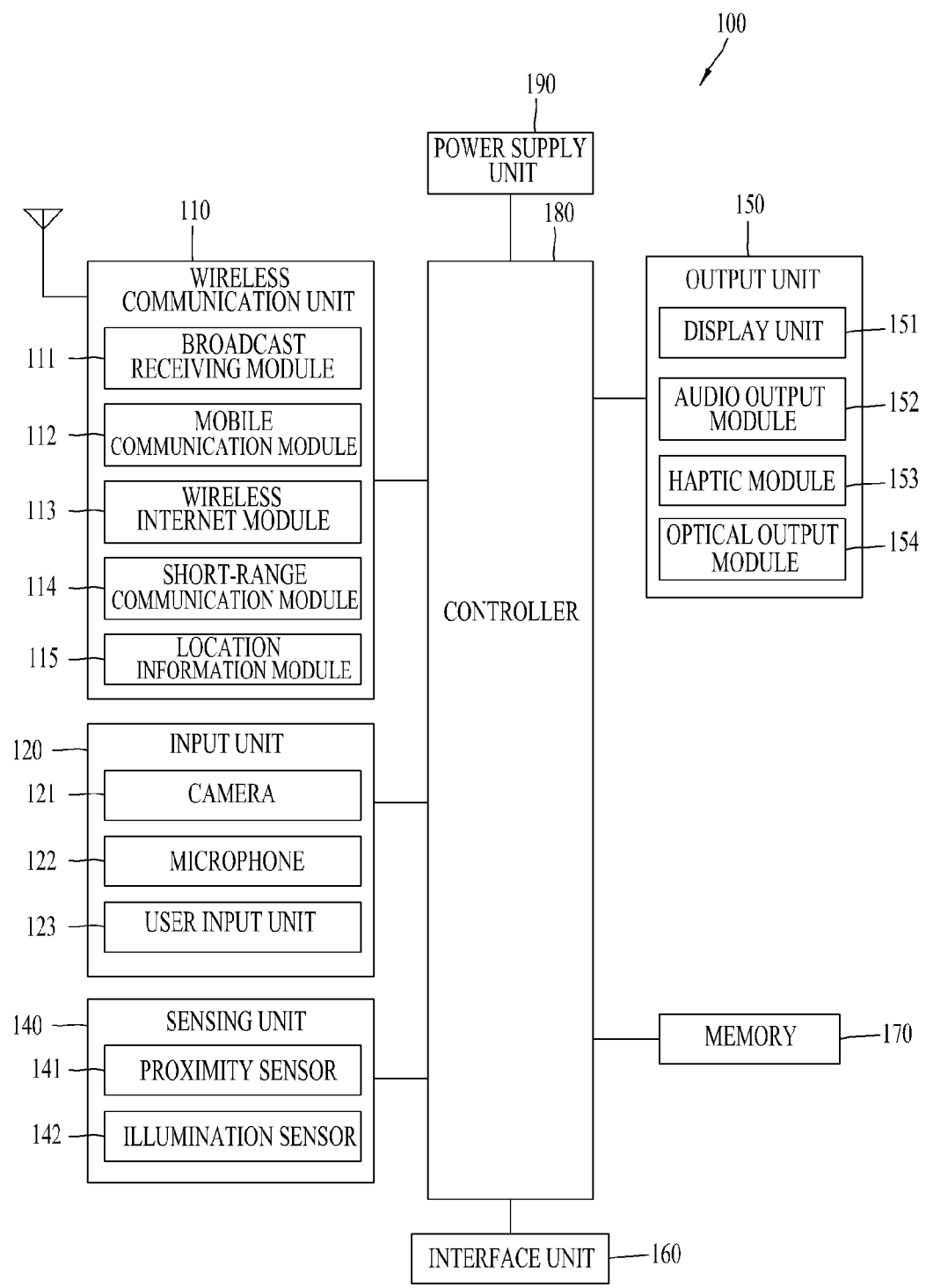
FIG. 1A is a block diagram of a mobile terminal in accordance with the present disclosure.

Description will now be given in detail according to exemplary embodiments disclosed herein, with reference to the accompanying drawings. For the sake of brief description with reference to the drawings, the same or equivalent components may be provided with the same reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In the present disclosure, that which is well-known to one of ordinary skill in the relevant art has generally been omitted for the sake of brevity. The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that although the terms first, second, etc. may be used herein to describe various elements, these elements should not be limited by these terms. These terms are generally only used to distinguish one element from another.

It will be understood that when an element is referred to as being "connected with" another element, the element can be directly connected with the other element or intervening elements may also be present. In contrast, when an element is referred to as being "directly connected with" another element, there are no intervening elements present.

A singular representation may include a plural representation unless it represents a definitely different meaning from the context. Terms such as "include" or "has" are used herein and should be understood that they are intended to indicate an existence of several components, functions or steps, disclosed in the specification, and it is also understood that greater or fewer components, functions, or steps may likewise be utilized.

Mobile terminals presented herein may be implemented using a variety of different types of terminals. Examples of such terminals include cellular phones, smart phones, user equipment, laptop computers, digital broadcast terminals, personal digital assistants (PDAs), portable multimedia players (PMPs), navigators, portable computers (PCs), slate PCs, tablet PCs, ultra books, wearable devices (for example, smart watches, smart glasses, head mounted displays (HMDs)), and the like.

By way of non-limiting example only, further description will be made with reference to particular types of mobile terminals. However, such teachings apply equally to other types of terminals, such as those types noted above. In addition, these teachings may also be applied to stationary terminals such as digital TV, desktop computers, and the like.

Figure 1B:
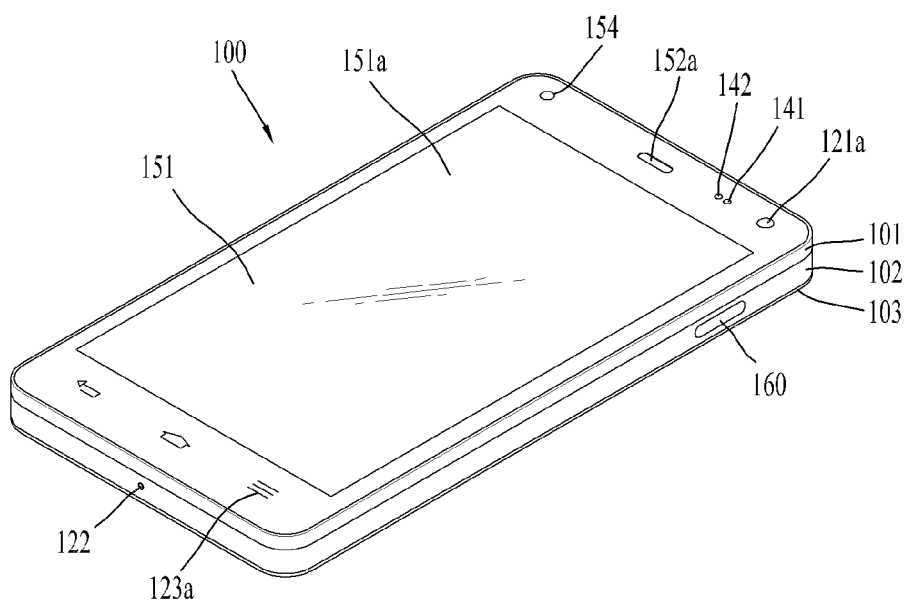
FIGS. 1B and 1C are conceptual views of one example of the mobile terminal, viewed from different directions.
Figure 1C:
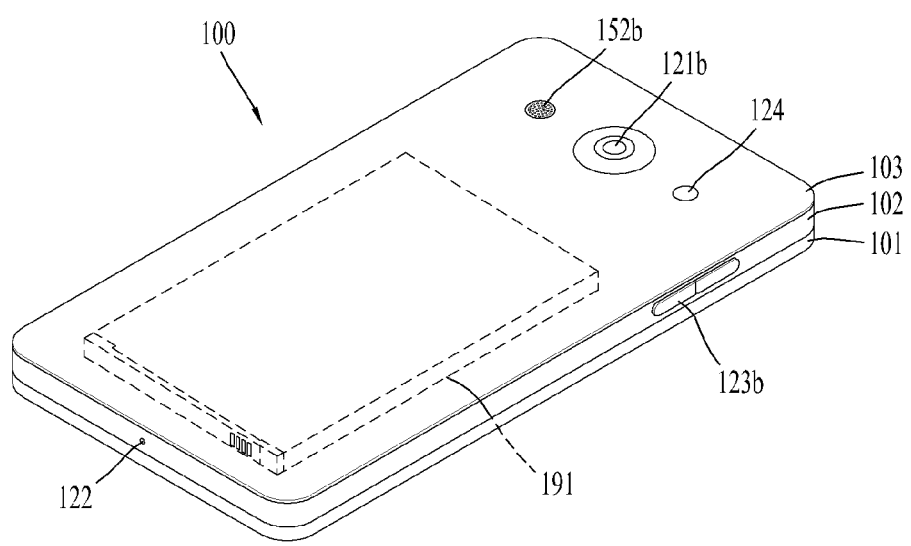

Reference is now made to FIGS. 1A-1C, where FIG. 1A is a block diagram of a mobile terminal in accordance with the present disclosure, and FIGS. 1B and 1C are conceptual views of one example of the mobile terminal, viewed from different directions.

The mobile terminal 100 is shown having components such as a wireless communication unit 110, an input unit 120, a sensing unit 140, an output unit 150, an interface unit 160, a memory 170, a controller 180, and a power supply unit 190. It is understood that implementing all of the illustrated components is not a requirement, and that greater or fewer components may alternatively be implemented.

Referring now to FIG. 1A, the mobile terminal 100 is shown having wireless communication unit 110 configured with several commonly implemented components. For instance, the wireless communication unit 110 typically includes one or more components which permit wireless communication between the mobile terminal 100 and a wireless communication system or network within which the mobile terminal is located.

The wireless communication unit 110 typically includes one or more modules which permit communications such as wireless communications between the mobile terminal 100 and a wireless communication system, communications between the mobile terminal 100 and another mobile terminal, communications between the mobile terminal 100 and an external server. Further, the wireless communication unit 110 typically includes one or more modules which connect the mobile terminal 100 to one or more networks.

To facilitate such communications, the wireless communication unit 110 includes one or more of a broadcast receiving module 111, a mobile communication module 112, a wireless Internet module 113, a short-range communication module 114, and a location information module 115.

The input unit 120 includes a camera 121 for obtaining images or video, a microphone 122, which is one type of audio input device for inputting an audio signal, and a user input unit 123 (for example, a touch key, a push key, a mechanical key, a soft key, and the like) for allowing a user to input information. Data (for example, audio, video, image, and the like) is obtained by the input unit 120 and may be analyzed and processed by controller 180 according to device parameters, user commands, and combinations thereof.

The sensing unit 140 is typically implemented using one or more sensors configured to sense internal information of the mobile terminal, the surrounding environment of the mobile terminal, user information, and the like. For example, in FIG. 1A, the sensing unit 140 is shown having a proximity sensor 141 and an illumination sensor 142.

If desired, the sensing unit 140 may alternatively or additionally include other types of sensors or devices, such as a touch sensor, an acceleration sensor, a magnetic sensor, a G-sensor, a gyroscope sensor, a motion sensor, an RGB sensor, an infrared (IR) sensor, a finger scan sensor, a ultrasonic sensor, an optical sensor (for example, camera 121), a microphone 122, a battery gauge, an environment sensor (for example, a barometer, a hygrometer, a thermometer, a radiation detection sensor, a thermal sensor, and a gas sensor, among others), and a chemical sensor (for example, an electronic nose, a health care sensor, a biometric sensor, and the like), to name a few. The mobile terminal 100 may be configured to utilize information obtained from sensing unit 140, and in particular, information obtained from one or more sensors of the sensing unit 140, and combinations thereof.

The output unit 150 is typically configured to output various types of information, such as audio, video, tactile output, and the like. The output unit 150 is shown having a display unit 151, an audio output module 152, a haptic module 153, and an optical output module 154. The display unit 151 may have an inter-layered structure or an integrated structure with a touch sensor in order to facilitate a touch screen. The touch screen may provide an output interface between the mobile terminal 100 and a user, as well as function as the user input unit 123 which provides an input interface between the mobile terminal 100 and the user.

The interface unit 160 serves as an interface with various types of external devices that can be coupled to the mobile terminal 100. The interface unit 160, for example, may include any of wired or wireless ports, external power supply ports, wired or wireless data ports, memory card ports, ports for connecting a device having an identification module, audio input/output (I/O) ports, video I/O ports, earphone ports, and the like. In some cases, the mobile terminal 100 may perform assorted control functions associated with a connected external device, in response to the external device being connected to the interface unit 160.

The memory 170 is typically implemented to store data to support various functions or features of the mobile terminal 100. For instance, the memory 170 may be configured to store application programs executed in the mobile terminal 100, data or instructions for operations of the mobile terminal 100, and the like. Some of these application programs may be downloaded from an external server via wireless communication. Other application programs may be installed within the mobile terminal 100 at time of manufacturing or shipping, which is typically the case for basic functions of the mobile terminal 100 (for example, receiving a call, placing a call, receiving a message, sending a message, and the like). It is common for application programs to be stored in the memory 170, installed in the mobile terminal 100, and executed by the controller 180 to perform an operation (or function) for the mobile terminal 100.

The controller 180 typically functions to control overall operation of the mobile terminal 100, in addition to the operations associated with the application programs.

The controller 180 may provide or process information or functions appropriate for a user by processing signals, data, information and the like, which are input or output by the various components depicted in FIG. 1A, or activating application programs stored in the memory 170. As one example, the controller 180 controls some or all of the components illustrated in FIGS. 1A-1C according to the execution of an application program that have been stored in the memory 170.

The power supply unit 190 can be configured to receive external power or provide internal power in order to supply appropriate power required for operating elements and components included in the mobile terminal 100. The power supply unit 190 may include a battery, and the battery may be configured to be embedded in the terminal body, or configured to be detachable from the terminal body.

Referring now to FIGS. 1B and 1C, the mobile terminal 100 is described with reference to a bar-type terminal body. However, the mobile terminal 100 may alternatively be implemented in any of a variety of different configurations. Examples of such configurations include watch-type, clip-type, glasses-type, or as a folder-type, flip-type, slide-type, swing-type, and swivel-type in which two and more bodies are combined with each other in a relatively movable manner, and combinations thereof. Discussion herein will often relate to a particular type of mobile terminal (for example, bar-type, watch-type, glasses-type, and the like). However, such teachings with regard to a particular type of mobile terminal will generally apply to other types of mobile terminals as well.

The mobile terminal 100 will generally include a case (for example, frame, housing, cover, and the like) forming the appearance of the terminal In this embodiment, the case is formed using a front case 101 and a rear case 102. Various electronic components are incorporated into a space formed between the front case 101 and the rear case 102. At least one middle case may be additionally positioned between the front case 101 and the rear case 102.

The display unit 151 is shown located on the front side of the terminal body to output information. As illustrated, a window 151a of the display unit 151 may be mounted to the front case 101 to form the front surface of the terminal body together with the front case 101.

In some embodiments, electronic components may also be mounted to the rear case 102. Examples of such electronic components include a detachable battery 191, an identification module, a memory card, and the like. Rear cover 103 is shown covering the electronic components, and this cover may be detachably coupled to the rear case 102. Therefore, when the rear cover 103 is detached from the rear case 102, the electronic components mounted to the rear case 102 are externally exposed.

As illustrated, when the rear cover 103 is coupled to the rear case 102, a side surface of the rear case 102 is partially exposed. In some cases, upon the coupling, the rear case 102 may also be completely shielded by the rear cover 103. In some embodiments, the rear cover 103 may include an opening 103' for externally exposing a camera 121b or an audio output module 152b.

The cases 101, 102, 103 may be formed by injection-molding synthetic resin or may be formed of a metal, for example, stainless steel (STS), aluminum (Al), titanium (Ti), or the like.

As an alternative to the example in which the plurality of cases form an inner space for accommodating components, the mobile terminal 100 may be configured such that one case forms the inner space. In this example, a mobile terminal 100 having a uni-body is formed in such a manner that synthetic resin or metal extends from a side surface to a rear surface.

If desired, the mobile terminal 100 may include a waterproofing unit (not shown) for preventing introduction of water into the terminal body. For example, the waterproofing unit may include a waterproofing member which is located between the window 151a and the front case 101, between the front case 101 and the rear case 102, or between the rear case 102 and the rear cover 103, to hermetically seal an inner space when those cases are coupled.

FIGS. 1B and 1C depict certain components as arranged on the mobile terminal.

In a front surface of the terminal body may be arranged a first audio output unit 152a, a proximity sensor 141, an illumination sensor 142, an optical output unit 154, a first camera 121a and a first manipulation unit 123a. In a lateral surface of the terminal body may be arranged a second manipulation unit 123b, a microphone 122 and an interface unit 160. In a rear surface of the terminal body may be arranged a second audio output unit 152b and a second camera 121b. Such the mobile terminal having the arrangements of the components in the terminal body is embodied as one example of the present disclosure.

It is to be understood that alternative arrangements are possible and within the teachings of the instant disclosure. Some components may be omitted or rearranged. For example, the first manipulation unit 123a may be located on another surface of the terminal body, and the second audio output module 152b may be located on the side surface of the terminal body.

The display unit 151 is generally configured to output information processed in the mobile terminal 100. For example, the display unit 151 may display execution screen information of an application program executing at the mobile terminal 100 or user interface (UI) and graphic user interface (GUI) information in response to the execution screen information.

The display unit 151 outputs information processed in the mobile terminal 100. The display unit 151 may be implemented using one or more suitable display devices. Examples of such suitable display devices include a liquid crystal display (LCD), a thin film transistor-liquid crystal display (TFT-LCD), an organic light emitting diode (OLED), a flexible display, a 3-dimensional (3D) display, an e-ink display, and combinations thereof.

The display unit 151 may be implemented using two display devices, which can implement the same or different display technology. For instance, a plurality of the display units 151 may be arranged on one side, either spaced apart from each other, or these devices may be integrated, or these devices may be arranged on different surfaces.

The display unit 151 may also include a touch sensor which senses a touch input received at the display unit. When a touch is input to the display unit 151, the touch sensor may be configured to sense this touch and the controller 180, for example, may generate a control command or other signal corresponding to the touch. The content which is input in the touching manner may be a text or numerical value, or a menu item which can be indicated or designated in various modes.

The touch sensor may be configured in a form of a film having a touch pattern, disposed between the window 151a and a display on a rear surface of the window 151a, or a metal wire which is patterned directly on the rear surface of the window 151a. Alternatively, the touch sensor may be integrally formed with the display. For example, the touch sensor may be disposed on a substrate of the display or within the display.

The display unit 151 may also form a touch screen together with the touch sensor. Here, the touch screen may serve as the user input unit 123 (see FIG. 1A). Therefore, the touch screen may replace at least some of the functions of the first manipulation unit 123a.

The first audio output module 152a may be implemented in the form of a speaker to output voice audio, alarm sounds, multimedia audio reproduction, and the like.

The window 151a of the display unit 151 will typically include an aperture to permit audio generated by the first audio output module 152a to pass. One alternative is to allow audio to be released along an assembly gap between the structural bodies (for example, a gap between the window 151a and the front case 101). In this case, a hole independently formed to output audio sounds may not be seen or is otherwise hidden in terms of appearance, thereby further simplifying the appearance and manufacturing of the mobile terminal 100.

The optical output module 154 can be configured to output light for indicating an event generation. Examples of such events include a message reception, a call signal reception, a missed call, an alarm, a schedule notice, an email reception, information reception through an application, and the like. When a user has checked a generated event, the controller can control the optical output unit 154 to stop the light output.

The first camera 121a can process image frames such as still or moving images obtained by the image sensor in a capture mode or a video call mode. The processed image frames can then be displayed on the display unit 151 or stored in the memory 170.

The first and second manipulation units 123a and 123b are examples of the user input unit 123, which may be manipulated by a user to provide input to the mobile terminal 100. The first and second manipulation units 123a and 123b may also be commonly referred to as a manipulating portion, and may employ any tactile method that allows the user to perform manipulation such as touch, push, scroll, or the like. The first and second manipulation units 123a and 123b may also employ any non-tactile method that allows the user to perform manipulation such as proximity touch, hovering, or the like.

FIG. 1B illustrates the first manipulation unit 123a as a touch key, but possible alternatives include a mechanical key, a push key, a touch key, and combinations thereof.

Input received at the first and second manipulation units 123a and 123b may be used in various ways. For example, the first manipulation unit 123a may be used by the user to provide an input to a menu, home key, cancel, search, or the like, and the second manipulation unit 123b may be used by the user to provide an input to control a volume level being output from the first or second audio output modules 152a or 152b, to switch to a touch recognition mode of the display unit 151, or the like.

As another example of the user input unit 123, a rear input unit (not shown) may be located on the rear surface of the terminal body. The rear input unit can be manipulated by a user to provide input to the mobile terminal 100. The input may be used in a variety of different ways. For example, the rear input unit may be used by the user to provide an input for power on/off, start, end, scroll, control volume level being output from the first or second audio output modules 152a or 152b, switch to a touch recognition mode of the display unit 151, and the like. The rear input unit may be configured to permit touch input, a push input, or combinations thereof.

The rear input unit may be located to overlap the display unit 151 of the front side in a thickness direction of the terminal body. As one example, the rear input unit may be located on an upper end portion of the rear side of the terminal body such that a user can easily manipulate it using a forefinger when the user grabs the terminal body with one hand. Alternatively, the rear input unit can be positioned at most any location of the rear side of the terminal body.

Embodiments that include the rear input unit may implement some or all of the functionality of the first manipulation unit 123a in the rear input unit. As such, in situations where the first manipulation unit 123a is omitted from the front side, the display unit 151 can have a larger screen.

As a further alternative, the mobile terminal 100 may include a finger scan sensor which scans a user's fingerprint. The controller 180 can then use fingerprint information sensed by the finger scan sensor as part of an authentication procedure. The finger scan sensor may also be installed in the display unit 151 or implemented in the user input unit 123.

The microphone 122 is shown located at an end of the mobile terminal 100, but other locations are possible. If desired, multiple microphones may be implemented, with such an arrangement permitting the receiving of stereo sounds.

The interface unit 160 may serve as a path allowing the mobile terminal 100 to interface with external devices. For example, the interface unit 160 may include one or more of a connection terminal for connecting to another device (for example, an earphone, an external speaker, or the like), a port for near field communication (for example, an Infrared Data Association (IrDA) port, a Bluetooth port, a wireless LAN port, and the like), or a power supply terminal for supplying power to the mobile terminal 100. The interface unit 160 may be implemented in the form of a socket for accommodating an external card, such as Subscriber Identification Module (SIM), User Identity Module (UIM), or a memory card for information storage.

The second camera 121b is shown located at the rear side of the terminal body and includes an image capturing direction that is substantially opposite to the image capturing direction of the first camera unit 121a. If desired, second camera 121a may alternatively be located at other locations, or made to be moveable, in order to have a different image capturing direction from that which is shown.

The second camera 121b can include a plurality of lenses arranged along at least one line. The plurality of lenses may also be arranged in a matrix configuration. The cameras may be referred to as an "array camera." When the second camera 121b is implemented as an array camera, images may be captured in various manners using the plurality of lenses and images with better qualities.

As shown in FIG. 1C, a flash 124 is shown adjacent to the second camera 121b. When an image of a subject is captured with the camera 121b, the flash 124 may illuminate the subject.

As shown in FIG. 1B, the second audio output module 152b can be located on the terminal body. The second audio output module 152b may implement stereophonic sound functions in conjunction with the first audio output module 152a, and may be also used for implementing a speaker phone mode for call communication.

At least one antenna for wireless communication may be located on the terminal body. The antenna may be installed in the terminal body or formed by the case. For example, an antenna which configures a part of the broadcast receiving module 111 may be retractable into the terminal body. Alternatively, an antenna may be formed using a film attached to an inner surface of the rear cover 103, or a case that includes a conductive material.

A power supply unit 190 for supplying power to the mobile terminal 100 may include a battery 191, which is mounted in the terminal body or detachably coupled to an outside of the terminal body.

The battery 191 may receive power via a power source cable connected to the interface unit 160. Also, the battery 191 can be recharged in a wireless manner using a wireless charger. Wireless charging may be implemented by magnetic induction or electromagnetic resonance.

The rear cover 103 is shown coupled to the rear case 102 for shielding the battery 191, to prevent separation of the battery 191, and to protect the battery 191 from an external impact or from foreign material. When the battery 191 is detachable from the terminal body, the rear cover 103 may be detachably coupled to the rear case 102.

Figure 2:
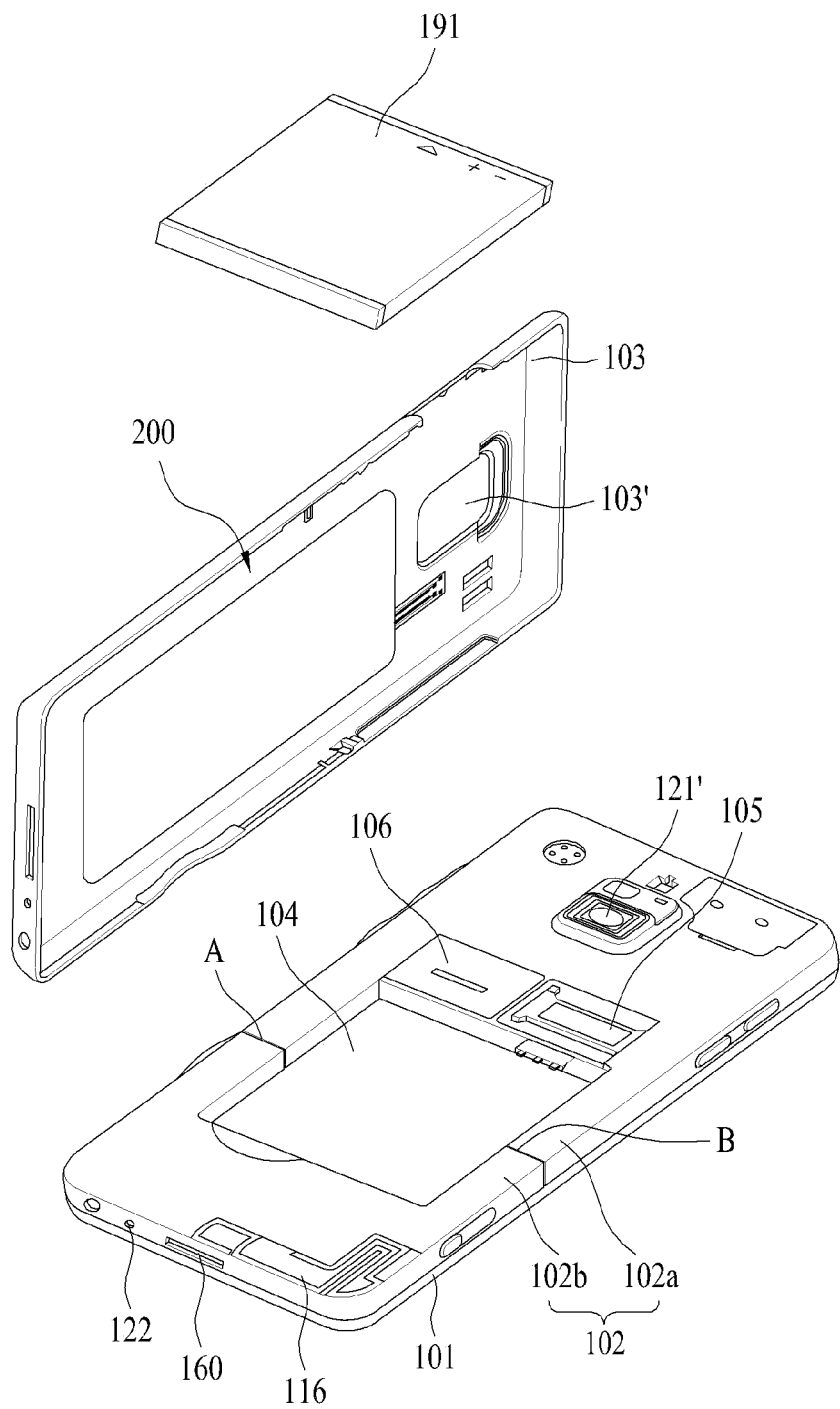
FIG. 2 is a diagram illustrating a state where a back cover is decoupled from one example of the mobile terminal in accordance with the present disclosure.

An accessory for protecting an appearance or assisting or extending the functions of the mobile terminal 100 can also be provided on the mobile terminal 100. As one example of an accessory, a cover or pouch for covering or accommodating at least one surface of the mobile terminal 100 may be provided. The cover or pouch may cooperate with the display unit 151 to extend the function of the mobile terminal 100. Another example of the accessory is a touch pen for assisting or extending a touch input to a touch screen FIG. 2 is a diagram illustrating a state where a back cover is decoupled from one example of the mobile terminal in accordance with the present disclosure. FIG. 2 shows a front case 101, a rear case 102, a rear cover (or a battery cover) 103, a camera 121', an interface 160, a microphone 122, an audio output unit 152', a battery 191, a battery loading unit 104, a USIM card loading unit 105, a memory card loading unit 106 and an antenna 116.

A surface of the rear case 102 has a predetermined space for loading external components such as the battery loading unit 104, the USIM card loading unit 105 and the memory card loading unit 106. Usually, the external components loaded in the surface of the rear case 102 are configured to expand the functions of the mobile terminal 100 so as to satisfy the diversified functions of the mobile terminal 100 and the diversified needs required by users.

As shown in FIG. 2, the battery 191 may be a removable type to compensate the large power consumption caused by the diversified functions of the mobile terminal The battery loading unit 104 is formed in the surface of the rear case 102 for the user to remove such a removable battery and to load another battery. A connection terminal is provided in the battery loading unit 104 to electrically connect the battery to the components embedded in the rear case.

The USIM card loading unit 105 or the memory card loading unit 106 may be formed next to the battery loading unit 104 or a bottom surface of the battery loading unit 104, to be exposed outside when the battery 191 is unloaded from the battery loading unit 104. In this instance, the battery loading unit 104 may be enlarged enough to facilitate a large battery 191.

FIG. 2 shows that the USIM card loading unit 104 or the memory card loading unit 106 is embedded in the rear surface of the rear case 102. Alternatively, the USIM card loading unit 104 or the memory card loading unit 106 may be insertedly provided in a lateral surface of the rear case to be insertedly loaded in or unloaded from the mobile terminal 100.

The rear cover 103 is configured to cover the surface of the rear case 102. The battery cover 103 may fixedly secure the battery 191, the USIM card and the memory card to prevent them from separating from the rear case and it may protect such the external components from external shocks or foreign substances. Recently, the battery cover 103 is provided with a water-proof structure configured to be shut off airtight when it is coupled to the rear case 102, to have a water-proof function which prevents water from leaking to the external components.

The antenna 116 is a mechanism configured to receive radio signals and examples of such radio signals include GPS (Global Positioning System) signals, WIFI (Wireless Fidelity) signals, LTE (Long Term Evolution) signals and DMB (Digital Multimedia Broadcasting) signals. As the mobile terminals become minimalized, the antennas become also minimalized. An antenna pattern is printed on a flexible printed circuit board, to form the antenna used for the mobile terminal.

The present disclosure is characterized in the antenna 116 which may be in close contact with the rear case 102. The structures of the rear case 102 and the antenna which may be in close contact with the rear case 102 will be described in detail, referring to FIGS. 3 through 7.

The antenna includes one or more of GPS (Global Positioning System) antennas, WIFI (Wireless Fidelity) antennas, LTE (Long Term Evolution) antenna and DMB (Digital Multimedia Broadcasting) antennas, to receive radio signals.

The antenna 116 includes a flexible printed circuit board and an antenna pattern formed on the flexible printed circuit board. The flexible printed circuit board may be formed of an insulation material and examples of the insulation material include poly imide (PI), polyester (PET) and glass epoxy (GE). The antenna pattern formed on the flexible circuit board may be formed of a conductive material which transmits signals.

The antenna 116 is formed in a manner of printing configured to print the antenna pattern on the flexible printed circuit board. Using the manner of the printing, a thin antenna pattern may be formed. A tape is disposed on a lower surface of the antennal having an upper surface where the antenna pattern is formed. After that, the antenna 116 having the tape and the antenna pattern is pressedly bonded to the rear case 102.

Alternatively, the antenna pattern may be directly formed in the rear case. When the rear case is too large or much unevenness is formed in the rear case in this instance, a process of forming the antenna pattern become complicated disadvantageously. Accordingly, the portion of the rear case where the antenna is formed is fabricated as an independent piece which will be assembled to the other portion of the rear case.

The portion of the second rear case 102b where the antenna 116 is formed may be referred to as an antenna carrier. The present disclosure may refer to the other portion of the rear case as a first rear case 102a and the portion where the antenna 116 is formed as a second rear case 102b.

The first rear case 102a is configured to cover a predetermined area of the mobile terminal and the second rear case 102b is configured to cover the other area of the mobile terminal. The first rear case 102a and the second rear case 102b cover the rear surface of the mobile terminal 100, except the area where the battery loading unit and the USIM card or memory card loading unit are provided. Usually, the first rear case 102a is arranged in an upper portion of the mobile terminal 100 and the second rear case 102b is arranged in a lower portion of the mobile terminal 100.

The first rear case 102a and the second rear case 102b are provided as independent pieces, respectively. When the back cover 103 is decoupled (or opened), connection units (A and B) between the first rear case 102a and the second rear case 102b are exposed. If the connection units (A and B) are spaced apart, external perfection could be destroyed.

Figure 3:
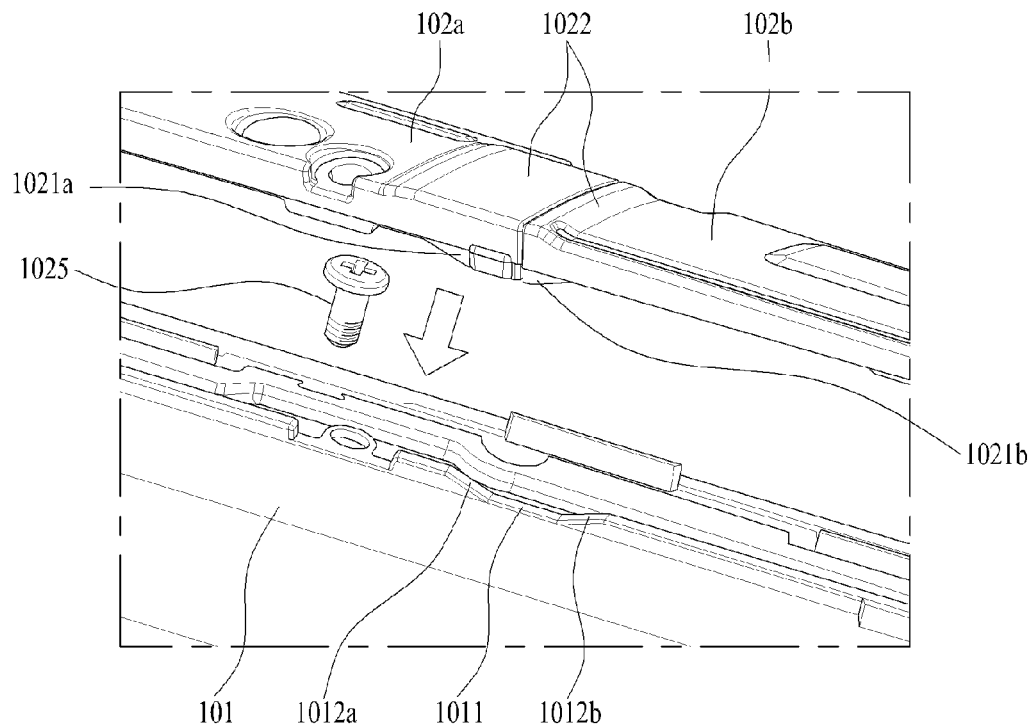
FIG. 3 is a diagram illustrating a coupling structure between a rear case and a front case provided in one example of the mobile terminal in accordance with the present disclosure.

The mobile terminal in accordance with the present disclosure uses the structure shown in FIG. 3 to solve the disadvantage of the spacing apart between the first rear case 102a and the second rear case 102b. FIG. 3 is a diagram illustrating a coupling structure between the rear case (102a and 102b) and the front case 101 provided in one example of the mobile terminal in accordance with the present disclosure.

There may be provided a tightening groove 1011 formed in the rear surface of the front case 101 and a tightening rib 1021a and 1021b forwardly projected from the rear case 102a and 102b.

The tightening groove 1011 is formed in the rear surface of the front case, corresponding to the area where the first rear case 102a faces the second case 102b in contact with each other. The tightening rib 1021a and 1021b are projected, corresponding to the recessed shape of the tightening groove 1011 to be inserted in the tightening groove 1011.

When the first rear case 102a and the second rear case 102b are arranged in a vertical direction with respect to the mobile terminal, the tightening groove 1011 includes inclined surfaces 1012a and 1012b provided in upper and lower portions thereof, respectively. The tightening groove 1011 may be formed in a triangle or diamond shape. The inclined surfaces 1012a and 1012b provided in both sides of the tightening groove 1011 may be in symmetry or asymmetry.

The tightening rib 1021a and 1021b forwardly projected from the rear case 102a and 102b has an inclined surface corresponding to the inclined surface of the tightening groove 1011. A first tightening rib 1021a projected from the first rear case 102a is in contact with the inclined surface 1012a formed in one direction with respect to the tightening groove 1011 and a second tightening rib 1021b is in contact with the inclined surface 1012b formed in the other direction with respect to the tightening groove 1011.

After the first rear case 102a and the second rear case 102b are arranged to locate the first tightening rib 1021a and the second tightening rib 1021b in the tightening groove 1011, the rear case 102a and 102b is coupled to the front case 101, using a screw 1025. Then, a compressive force is applied between the rear case 102a and 102b and the front case 101 in a direction along the thickness (or a direction along the insertion of the screw 1025). The first tightening rib 1021a is provided with the force in the other direction (or a downward direction) and the second tightening rib 1021b is provided with the force in one direction (or an upward direction) by the inclined surfaces 1012a and 1012b.

Once the first tightening rib 1021a and the second tightening rib 1021b are provided with the force in the upward and downward direction, the first rear case 102a is provided with the force in the downward direction and the second rear case 102b is provided with the force in the upward direction. Accordingly, the spaced gap between the first rear case 102a and the second rear case 102b may be narrowed (or decreased) effectively.

A boss into which the screw 1025 is inserted may be formed adjacent to the tightening groove 1011 to provide insertion force when the tightening ribs 1021a, 1021b are inserted to the tightening groove 1011. The tightening ribs 1021a, 1021b or the tightening groove 1011 may be formed of a flexible material such as silicon. In this instance, when the rear case 102a and 102b is coupled to the front case 101, the spaced gap maybe filled with the flexible material and then a water-proof function may be added. At this time, the tightening ribs 1021a, 1021b or the tightening groove 1011 may be fabricated in a manner of double-injection molding, using a flexible material.

Figure 4:
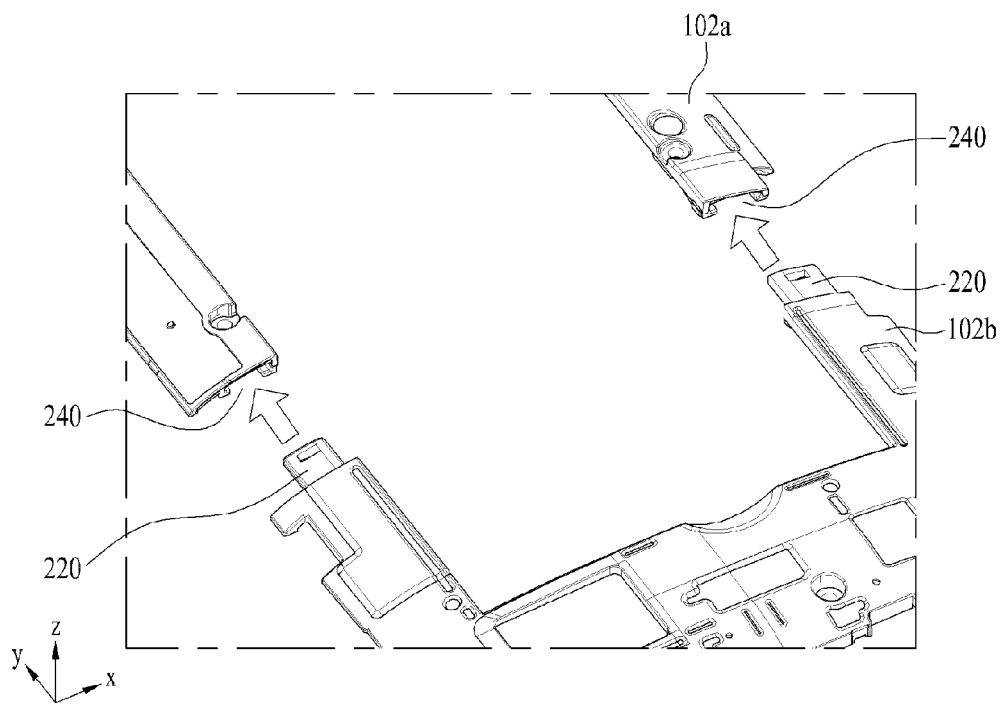
FIG. 4 is a diagram illustrating connection between a first rear case and a second rear case provided in one example of the mobile terminal in accordance with the present disclosure.

FIG. 4 is a diagram illustrating connection between the first rear case 102a and the second rear case 102b in one example of the mobile terminal in accordance with the present disclosure. After the first rear case 102a and the second rear case 102b in accordance with the present disclosure may be slidingly connected with each other, the rear case 102a and 102b may be coupled to the front case 101.

In the conventional rear case, the first rear case 102a and the second rear case 102b are coupled to the front case 101 independently. Accordingly, additional processes have to be provided and fabrication errors could be generated in the process of coupling the two pieces to the front case 101 and the portion between the first rear case 102a and the second rear case 102b coupled to the front case could be substantially weak.

In one example of the mobile terminal in accordance with the present disclosure, the first rear case 102a and the second rear case 102b are connectedly coupled to each other before they are coupled to the front case 101 independently. As a result, the number of processes required to fabricate the mobile terminal may be reduced and the rigidity between the first rear case 102a and the second rear case 102b may be enhanced.

The rear case 102a and 102b coupled to the rear surface of the mobile terminal has no battery loading portion. The first rear case 102a and the second rear case 102b are connected to each other in the portion next to the battery loading unit. Accordingly, the first rear case 102a and the second rear case 102b may form ⊏-shaped profile, facing each other in right and left portions with respect to the battery loading unit.

A connecting projection 220 is formed in a predetermined area of the portion where the first rear case 102a and the second rear case 102b face each other to be slidingly connected to each other and a connecting slot 240 is formed in the other predetermined area of the portion. In the drawing, the connecting slot 240 is formed in the portion of the first rear case 102a and the connecting projection 220 is formed in the portion of the second rear case 102b, and vice versa.

As shown in FIG. 4, the portion where one connecting projection 220 and one connecting slot 240 are provided in the ⊏-shaped profile of the first rear case 102a and the second rear case 102b may be referred to as a first connection unit (A). the other portion where the other connecting projection 220 and the other connecting slot 240 are provided in the ⊏-shaped profile may be referred to as a second connection unit (B). Viewed in the embodiment of FIG. 4, a left portion may be the first connection unit (A) and a right portion may be the second connection unit (B), vice versa. The first connection unit (A) and the second connection unit (B) have substantially similar structures. Accordingly, the first connection unit (A) is described and repeated description is omitted.

Figure 5:
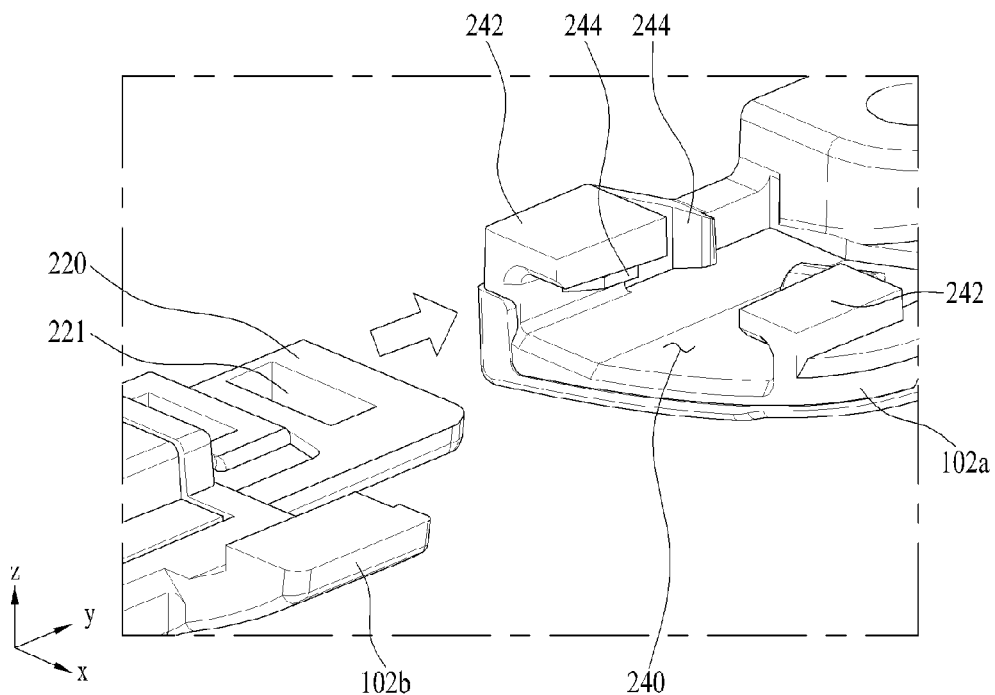
FIG. 5 is a perspective diagram illustrating a state before the first rear case and the second rear case are connected to each other in a first connection unit in one example of the mobile terminal in accordance with the present disclosure.
Figure 6:
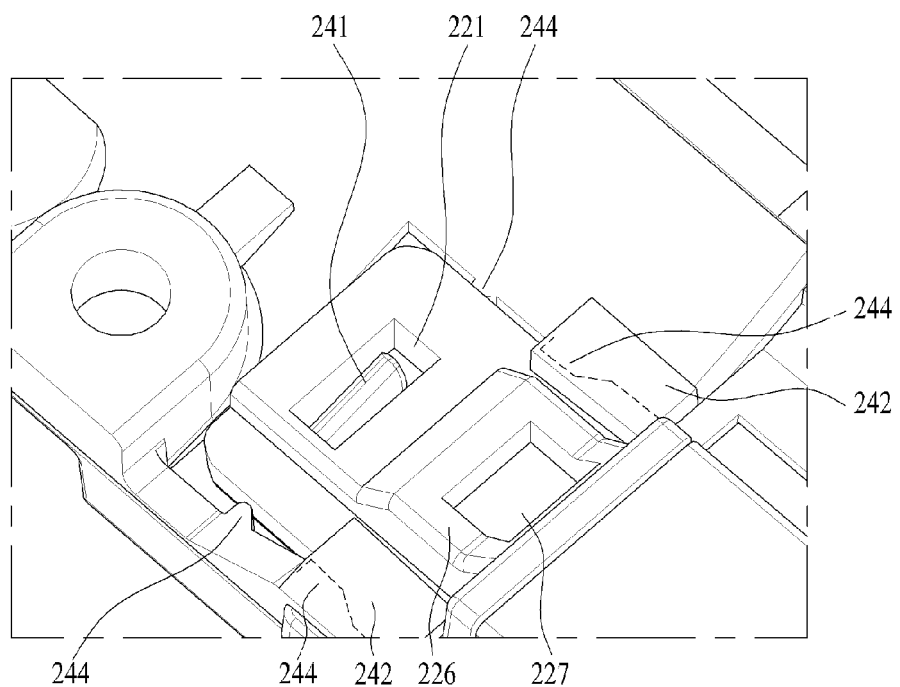
FIG. 6 is a perspective diagram illustrating the first connection unit between the first rear case and and the second rear case in one example of the mobile terminal in accordance with the present disclosure.

FIG. 5 is a perspective diagram illustrating a state before the first rear case 102a and the second rear case 102b are connected to each other in the first connection unit (A) in one example of the mobile terminal in accordance with the present disclosure. FIG. 6 is a perspective diagram illustrating the first connection unit (A) between the first rear case 102a and the second rear case 102b in one example of the mobile terminal in accordance with the present disclosure. An upper portion shown in FIG. 5 (or in +direction with respect to z-axis) is in contact with the front case 101 and a lower portion (or in −direction with respect z-axis) is arranged in a rear surface of the rear case.

The connecting slot 240 formed in the first rear case 102a has a closed area in a backward direction and a partially open area in a forward direction, so as to secure more space for loading the components and to facilitate the connecting and disconnecting of the first rear case 102a and the second rear case 102b.

The connecting projection 220 is inserted in the connecting slot 240 in a y-axial direction. Supporters 242 for supporting the connecting projection are provided in both sides of the connecting slot 240, respectively, to prevent separation of the connecting projection in a z-axial direction. The connecting slot 240 has a cross-sectional area which is blocked by the rear and lateral surfaces of the first rear case 102a and the supporters 242 and open in a forward direction. The z-axial direction movement of the connecting projection after the rear case 102a and 102b is coupled to the front case 101 may be minimized, using a screw 1025.

A securing hook 241 may be projected from an inner surface of the connecting slot 240 and a securing groove 221 may be formed in the connecting projection 220 to prevent separation of the connecting projection 220 inserted in the connecting slot 240 in a y-axial direction. When the securing hook 241 is coupled to the securing groove 221 as shown in FIG. 6, the y-axial movement of the connecting projection is fixed. If it is necessary to uncouple the securing hook 241 from the securing groove, an upper portion of the first rear case 102a and a lower portion of the second rear case 102b are pressed in a direction to the rear surface and then the securing hook 241 is decoupled from the securing groove. In this instance, they are decoupled from each other, because of the forwardly open area of the connecting slot 240 except the supporters 242.

As the securing groove 221 is larger than the securing hook 241, there may be y-axial movement. However, after the rear case 102a and 102b is coupled to the front case 101, the y-axial spacing apart between the tightening rib 1021a and 1021b and the tightening groove 1011 may be prevented as shown in FIG. 3.

Movement preventing projections 244 projected from an inner surface of the connecting slot 240 in an x-axial direction may be further provided to prevent x-axial movement. Referring to FIG. 6, the movement preventing projections 244 are projected from right and left areas of the connecting slot 240, respectively. The movement preventing projection has an inclined surface inclined toward an entrance of the connecting slot 240. The connecting projection 220 may be smoothly inserted along the inclined surface.

As shown in FIG. 6, a plurality of movement preventing projections may be formed in a length direction (or y-axial direction) of the connecting slot 240 to prevent the axial rotation. Alternatively, the movement preventing projection 244 may be extended in a longitudinal direction of the connecting slot so as to gain the similar effect to the effect gained when the plurality of the movement preventing projections are provided.

The thickness of the connecting projection 220 is smaller than the overall thickness of the second rear case 102b, so that the connecting projection has a substantially less rigidity. To compensate the weak rigidity, a reinforcing rib 226 may be further provided in a predetermined portion of the connecting projection 220 which is not overlapped with the supporter 242. If the reinforcing rib 226 is too large, it is difficult to decouple the securing hook 241 from the securing groove. Accordingly, a recess 227 is formed in the reinforcing rib 226 to adjust the rigidity of the connecting portion between the connecting projection 220 and the second rear case 102b.

Figure 7:
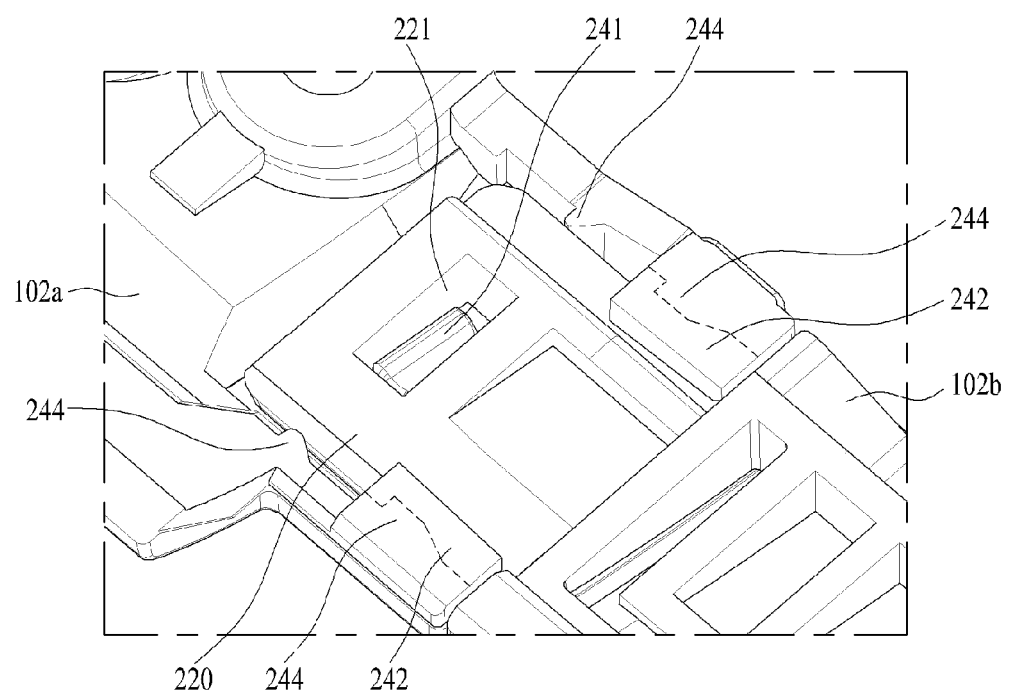
FIG. 7 is a perspective diagram illustrating a second connection unit between the first rear case and the second rear case in one example of the mobile terminal in accordance with the present disclosure.

FIG. 7 is a perspective diagram illustrating the second connection unit (B) between the first rear case 102a and the second rear case 102b in one example of the mobile terminal in accordance with the present disclosure. The second connection unit (B) is similar to the first connection unit (A) mentioned above, except that no reinforcing rib 226 is provided. The second connection unit (B) is the portion where the printed circuit board passes and it is less weak than the first connection unit (A), so that the reinforcing rib 226 can be omitted.

Referring to FIG. 3, end portions 1022 of the first and second rear cases 102a and 102b may be formed thicker than the other portions to reinforce the rigidity, so that the breakage of the connecting projection 220 can be prevented.

According to at least one of the embodiments mentioned above, the space between the rear cases 102a and 102b configured as two pieces may be reduced and the external aesthetic impression of the rea surface of the mobile terminal.

Furthermore, the rear case 102a and 102b is configured as one material so that the coupling efficiency of the rear case to the front case and the rigidity of the rear case may be enhanced.

The foregoing embodiments are merely exemplary and are not to be considered as limiting the present disclosure. The present teachings can be readily applied to other types of methods and apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments. As the present features may be embodied in several forms without departing from the characteristics thereof, it should also be understood that the above-described embodiments are not limited by any of the details of the foregoing description, unless otherwise specified, but rather should be considered broadly within its scope as defined in the appended claims, and therefore all changes and modifications that fall within the metes and bounds of the claims, or equivalents of such metes and bounds, are therefore intended to be embraced by the appended claims.

What is claimed is:

1. A mobile terminal comprising:
a front case comprising a front surface;
a display coupled to the front surface of the front case;
a first rear case coupled to the front case and shaped to cover a first area of a rear surface of the front case;
a second rear case coupled to the front case and shaped to cover a second area of the rear surface of the front case, the second rear case coupled to the first rear case;
a tightening groove formed at a portion of the rear surface of the front case that corresponds to a position where the coupled first rear case and second rear case are in contact with each other, the tightening groove comprising a first inclined surface inclined in a first direction and a second inclined surface inclined in a second direction;
a first tightening rib projecting from a front surface of the first rear case and comprising a third inclined surface corresponding to the first inclined surface of the tightening groove; and
a second tightening rib projecting from a front surface of the second rear case and comprising a fourth inclined surface corresponding to the second inclined surface of the tightening groove,
wherein the first rear case and the second rear case are coupled to the front case by having the first tightening rib and the second tightening rib of the coupled first rear case and second rear case inserted into the tightening groove.

2. The mobile terminal of claim 1, wherein:
the tightening groove is formed in a diamond shape;
the first tightening rib is formed in a diamond shape; and
the second tightening rib is formed in a triangle shape.

3. The mobile terminal of claim 1, wherein:
the first tightening rib and the second tightening rib comprise a flexible material; and
the first rear case and the second rear case are coupled to each other by double-injection molding.

4. The mobile terminal of claim 1, further comprising:
one or more screws fastened to the front case by passing through at least one of the first rear case or the second rear case,
wherein at least one of the one or more screws is fastened adjacent to the tightening groove.

5. The mobile terminal of claim 1, further comprising:
a connecting slot extended in a y-axial direction from one end portion of the first rear case;
a connecting projection projecting in the y-axial direction from one end of the second rear case such that the first rear case and the second rear case that are arranged in the y-axial direction are coupled to each other via the connecting projection inserted into the connecting slot;
a securing hook projecting from an inner surface of the connecting slot; and
a securing groove formed in the connecting projection and shaped to receive the securing hook when the connecting projection is inserted into the connecting slot.

6. The mobile terminal of claim 5, wherein:
the securing hook is projected in a z-axial direction that corresponds to a thickness direction of the mobile terminal; and
the connecting slot comprises an open portion formed in a surface facing the inner surface from which the securing hook is projected.

7. The mobile terminal of claim 6, further comprising:
a movement preventing projection projecting from the inner surface of the connecting slot in an x-axial direction that is vertical to the z-axial direction.

8. The mobile terminal of claim 7, further comprising a plurality of movement preventing projections projecting from the connection slot in the x-axial direction, each of the plurality of movement prevention projections being spaced apart in the y axial direction.

9. The mobile terminal of claim 7, wherein the movement preventing projection comprises an inclined surface provided in a surface toward an entrance of the connecting slot.

10. The mobile terminal of claim 9, wherein the movement preventing projection is extended in the y-axial direction and formed in a diamond shape.

11. The mobile terminal of claim 5, further comprising:
a reinforcing rib projected from the connecting projection,
a thickness of the reinforcing rib being greater than a thickness of the connecting projection.

12. The mobile terminal of claim 1, further comprising:
an antenna printed on a surface of the second rear case.

* * * * *

UNITED STATES PATENT AND TRADEMARK OFFICE
CERTIFICATE OF CORRECTION

PATENT NO. : 9,552,016 B2  
APPLICATION NO. : 14/846391  
DATED : January 24, 2017  
INVENTOR(S) : Joonhee Yoo, Jinhwan Lee and Suhyeong Lee Page 1 of 1

It is certified that error appears in the above-identified patent and that said Letters Patent is hereby corrected as shown below:

On the Title Page

Item (73) Assignee:; delete "LG ELEVTRONICS INC." and insert --LG ELECTRONICS INC.--

Signed and Sealed this
Eighth Day of August, 2017

Joseph Matal
*Performing the Functions and Duties of the*
*Under Secretary of Commerce for Intellectual Property and*
*Director of the United States Patent and Trademark Office*